United States Patent
Gochnour et al.

(10) Patent No.: US 6,830,719 B2
(45) Date of Patent: Dec. 14, 2004

(54) METHOD FOR REDUCING WARPAGE DURING APPLICATION AND CURING OF ENCAPSULANT MATERIALS ON A PRINTED CIRCUIT BOARD

(75) Inventors: Derek J. Gochnour, Boise, ID (US); Leonard E. Mess, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/358,573

(22) Filed: Feb. 5, 2003

(65) Prior Publication Data

US 2003/0111766 A1 Jun. 19, 2003

Related U.S. Application Data

(63) Continuation of application No. 09/834,707, filed on Apr. 13, 2001, now Pat. No. 6,527,999, which is a continuation of application No. 09/170,628, filed on Oct. 7, 1998, now Pat. No. 6,224,936.

(51) Int. Cl.[7] .......................... B29C 35/02; B29C 53/16; B05D 15/12
(52) U.S. Cl. .................. 264/231; 264/266; 264/272.13; 264/272.17; 427/96; 427/282
(58) Field of Search ................................. 264/229, 230, 264/266, 267, 272.13, 272.17, 231, 271.1, 272.15, 275; 29/831, 835; 427/96, 282, 272, 275

(56) References Cited

U.S. PATENT DOCUMENTS

| | | |
|---|---|---|
| 1,750,369 A | 3/1930 | Septer |
| 3,614,540 A | 10/1971 | Slusser |
| 3,930,644 A | 1/1976 | Albert, Jr. |
| 4,339,407 A | 7/1982 | Leighton |
| 4,463,636 A | 8/1984 | Heller et al. |
| 4,510,008 A | 4/1985 | Hoshi et al. |
| 4,554,613 A | 11/1985 | Kaufman |
| 4,701,999 A | 10/1987 | Palmer |
| 4,763,782 A | 8/1988 | Sinchok |
| 4,805,316 A | 2/1989 | Curti |
| 4,842,412 A | 6/1989 | Miyake |
| 4,943,334 A | 7/1990 | Medney et al. |
| 4,948,108 A | 8/1990 | Sullivan |
| 4,953,061 A | 8/1990 | Nitkiewicz |
| 5,037,691 A | 8/1991 | Medney et al. |
| 5,052,338 A | 10/1991 | Maiorca et al. |
| 5,110,615 A | 5/1992 | Maiorca et al. |
| 5,111,935 A | 5/1992 | Bond et al. |
| 5,148,962 A | 9/1992 | Jones et al. |
| 5,156,983 A | 10/1992 | Schlesinger et al. |
| 5,271,953 A | 12/1993 | Litteral |
| 5,298,464 A | 3/1994 | Schlesinger et al. |
| 5,350,455 A | 9/1994 | Mahler |
| RE34,794 E | 11/1994 | Farnworth |
| 5,376,326 A | 12/1994 | Medney et al. |
| 5,444,304 A | 8/1995 | Hara et al. |
| 5,450,289 A | 9/1995 | Kweon et al. |
| 5,451,815 A | 9/1995 | Taniguchi et al. |
| 5,456,402 A | 10/1995 | Curtin |
| 5,492,866 A | 2/1996 | Nishikawa |
| 5,501,436 A | 3/1996 | Miller |
| 5,635,760 A | 6/1997 | Ishikawa |
| 5,653,020 A | 8/1997 | Romano et al. |
| 5,820,013 A | 10/1998 | Ortiz |
| 5,868,887 A | 2/1999 | Sylvester et al. |
| 6,027,590 A | 2/2000 | Sylvester et al. |
| 6,122,170 A | 9/2000 | Hirose et al. |
| 6,164,636 A | 12/2000 | Taylor |
| 6,174,482 B1 | 1/2001 | Reames et al. |
| 6,206,352 B1 | 3/2001 | Ishitani et al. |
| 6,224,936 B1 | 5/2001 | Gochnour et al. |
| 6,237,832 B1 | 5/2001 | Chung |
| 6,527,999 B2 * | 3/2003 | Gochnour et al. .......... 264/266 |

FOREIGN PATENT DOCUMENTS

JP           57-8050 A           1/1982

* cited by examiner

*Primary Examiner*—Angela Ortiz
(74) *Attorney, Agent, or Firm*—TraskBritt

(57) ABSTRACT

A method and apparatus for preventing board warpage during the application and curing or drying of liquid epoxies, or the like, on printed circuit boards using a clamping fixture assembly, which includes at least one clamping fixture support and at least one clamping fixture overlay. If desired, a plurality of printed circuit boards may be processed using an appropriate clamping fixture assembly. Furthermore, the clamping fixture may be constructed so a slight bow or curvature thereof can counter either a convex or concave bow or curvature of the printed circuit board.

11 Claims, 3 Drawing Sheets

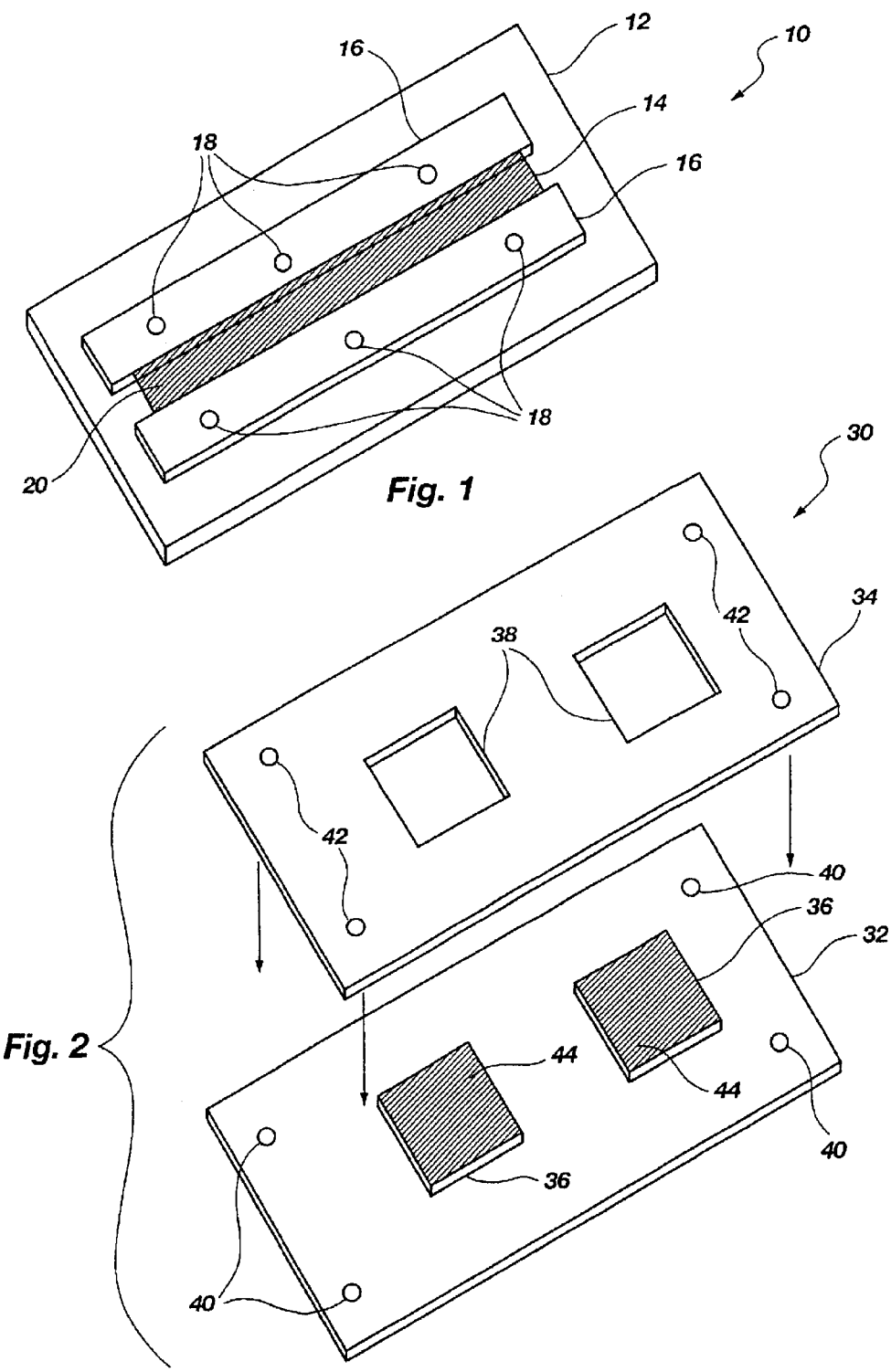

METHOD FOR REDUCING WARPAGE DURING APPLICATION AND CURING OF ENCAPSULANT MATERIALS ON A PRINTED CIRCUIT BOARD

CROSS-REFERENCE TO RELATED APPLICATIONS

This application is a continuation of application Ser. No. 09/834,707 filed Apr. 13, 2001, now U.S. Pat. No. 6,527,999, issued Mar. 4, 2003, which is a continuation of application Ser. No. 09/170,628, filed Oct. 7, 1998, now U.S. Pat. No. 6,224,936, issued May 1, 2001.

BACKGROUND OF THE INVENTION

1. Field of the Invention

The present invention relates generally to preparing printed circuit boards for the mounting of semiconductor devices thereon. More particularly, the present invention is directed to the preparation and fabrication of printed circuit boards to reduce warpage caused by the application of epoxy encapsulant material placed upon the surface of the printed circuit board.

2. State of Art

The fabrication of integrated circuits on areas of a wafer to form a discrete semiconductor die thereon is a long and complex process. One of the last steps in the process is that of encapsulating the semiconductor die as a semiconductor device and then attaching the die to a printed circuit board (PCB) or other type of die carrier.

Conformal coatings and encapsulants are typically applied as one of the last major processes of the fabrication of either the printed circuit board or other type of die carriers. In either case, the combination of the semiconductor device attached to a printed circuit board or other type of die carrier has increased the value of the assembly over the value of the separate components. Therefore, the mounting of the semiconductor device and the encapsulation thereof on the printed circuit board or other type of die carrier must have a high reliability and high yield, respectively.

Encapsulation of the semiconductor device protects the semiconductor device during any subsequent processing and prevents mechanical damage while providing protection from the operating environment for the semiconductor device.

Conformal coatings are used to encapsulate and protect various types of electronic packages, primarily from their operating environments. Specialized coatings have been developed to provide an enhanced protection from direct attack of hostile gases and liquids on critical surfaces of the packages. Polymeric films act only as semihermetic barriers because of reduced solubility or permeability of a hostile reactant in the polymeric material, or both.

Polyamides, polyamide-imids, and silicones have been developed for applications that can tolerate high cure temperatures and that need protection at elevated temperatures. These types of materials are most frequently used either directly on the semiconductor die at the die level as passivating layers thereon or at the die carrier level. Polyurethanes, fluoropolymers, silicones, accrolades, and epoxies are most commonly used for components and printed circuit boards. These materials are typically applied from solution by emersion or spray coating or they may be applied via stencil coating or direct spreading. After curing, most coatings used on the semiconductor devices and a printed circuit board or other type of carrier are difficult to remove because they become cross-linked during the curing process.

Materials typically used to encapsulate semiconductor dice mounted on various types of lead frames and to seal metal cans housing semiconductor dice and their carrier, as well as many other components, including potting and molding compounds as well as glob top encapsulants, must provide protection from handling damage for the semiconductor dice and their carrier in the post processing environment and any subsequent operating environment. Semiconductor dice are most frequently electrically connected to the lead frame by bonding wires between the bond pads on the semiconductor die and the leads of the lead frame (wire bonding). Flip chips use small solder balls as interconnects to a substrate and tape automated bonding using thermal compression bonding to form interconnections between the circuits located on the tape and the bond pads of the semiconductor die. Interconnections between substrates and semiconductor dice, as well as other components, are fragile and subject to stress failures. The encapsulant must not generate catastrophic stresses due to the chemical curing process of the encapsulant material or stresses due to differing rates of thermal expansion of the semiconductor die, substrate, and encapsulant during the thermal cycling thereof.

Initially, rigid epoxies were primarily used for encapsulation. Epoxies have the advantages of relatively little shrinkage, high resistance to processed chemicals, and good mechanical properties. Since semiconductor device package sizes are growing, highly filled epoxies with reduced thermal expansion have been developed to reduce stresses in these packages.

Unfortunately, even the best of epoxies still has some level of shrinkage that results in warpage of the underlying substrate, such as a printed circuit board (PCB). The warpage of a printed circuit board can stress the board enough to either cause it to fail or to cause any of the attached semiconductor devices to fail. Failure of semiconductor devices typically occurs because the solder links between the semiconductor device and the circuits on the printed circuit board failed due to the stress caused by the warpage of the board. Conformal coatings may also incur stress on a surface mounted chip (SMC) during thermal cycling of the chip and printed circuit board, causing the solder joints to crack or the components to fracture. Differences between the coefficients of thermal expansion of the encapsulant, the coating, the printed circuit board, and a semiconductor device mounted thereon cause greater stress during thermal cycling. A coating that has a coefficient of thermal expansion (CTE) nearly matching that of the substrate and the semiconductor devices mounted thereon will produce less stress therebetween and attendant cracking when subjected to thermal cycling. Larger surface-mounted chips are more vulnerable to damage from stresses during curing of the encapsulant material and thermal cycling of the chip and substrate due to the differences in the coefficients of thermal expansion of the chip and substrate causing stresses therebetween.

The thicker the coating or encapsulant thickness of a semiconductor device, the greater the likelihood of stress on the semiconductor device and its connections or interconnects to the substrate from shrinkage of the coating or encapsulant. Some surface-mounted chips may not be able to withstand mechanical stresses induced during curing of thick coatings, which may also result in the warpage of the printed circuit board upon which the chip is mounted. If the solder interconnections between a semiconductor device and the circuits of a printed circuit board are closely spaced, conventional coating materials and encapsulant materials may move the semiconductor device, thereby cracking the solder joints as such material cures. In addition, thicker material coatings or thicker encapsulant material may act as barriers to heat transfer from densely packed surface mount chips during the operation thereof.

BRIEF SUMMARY OF THE INVENTION

The present invention is directed to a method and apparatus for preventing board warpage during the application and curing or drying of liquid epoxies, or the like, on printed circuit boards. A clamping fixture assembly, which includes at least one clamping fixture support and at least one clamping fixture overlay, is used to restrain the printed circuit board on a flat surface during the curing of the epoxy. If desired, a plurality of printed circuit boards may be processed using an appropriate clamping fixture assembly. Furthermore, the clamping fixture may be constructed so a slight bow or curvature thereof can counter either a convex or concave bow or curvature of the printed circuit board.

In the method, at least one printed circuit board is mounted to a clamping fixture support where a clamping fixture overlay is placed on top of the first printed circuit board. Next, an aperture in the clamping fixture overlay allows for the application of an encapsulation material, such as an encapsulant epoxy, to be spread within an area bordered by an epoxy dam. Next, the epoxy is cured or dried on the printed circuit board. Such curing or drying can be performed within an oven for a predetermined period of time at a predetermined temperature sufficient to optimize curing or drying of the epoxy without excessive board warpage, such warpage being limited by the printed circuit board being retained in the clamping fixture assembly.

BRIEF DESCRIPTION OF THE SEVERAL VIEWS OF THE DRAWINGS

FIG. 1 is a perspective view of one embodiment of a clamping fixture apparatus according to the present invention;

FIG. 2 is an exploded perspective view of a clamping fixture apparatus that allows more than one printed circuit board to be encapsulated;

DETAILED DESCRIPTION OF THE INVENTION

Figure 3:
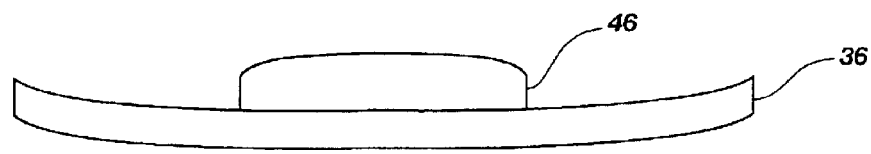
FIG. 3 depicts the problem of printed circuit board warpage.

Referring to drawing FIGS. 1 and 3, a perspective diagram depicts a first embodiment of a clamping fixture assembly apparatus 10 of the present invention that is used to prevent a printed circuit board from warping during application and curing of epoxy resins used during the encapsulation or sealing of the semiconductor devices mounted on the printed circuit board. The warpage of a printed circuit board 36 having a semiconductor device 46 located thereon is illustrated in drawing FIG. 3. The clamping fixture assembly apparatus 10 includes a support base 12 and one or more clamping elements 16. A printed circuit board 14 having at least one semiconductor device mounted thereon is mounted on the support base 12. A plurality of clamping elements 16 is mounted upon the surface of support base 12 along the edge region of printed circuit board 14. A plurality of threaded fasteners, retaining elements 18, is used to retain each clamping element 16 on the support base 12 so as to apply a downward force along the opposing edges of printed circuit board 14. The support base 12 may be substantially flat or may have a slight radius of curvature that may be either concave or convex. Concave applications are useful in removing a convex bowing of a printed circuit board 14 while a convex surface would be helpful in eliminating a concave bowing of a printed circuit board 14. Once a printed circuit board 14 is placed and retained securely within clamping fixture assembly apparatus 10, an epoxy encapsulant material 20 may be spread across a portion of the surface or the entire surface of the printed circuit board 14 and then allowed to cure. The curing stage may include drying and curing in an ambient temperature, or the entire clamping fixture assembly apparatus 10 having printed circuit board 14 mounted thereon may be placed within a curing oven to cure at a predetermined temperature for a predetermined length of time. Higher temperatures typically lead to greater warpage so an optimal range of time and temperature that minimizes shrinkage of the epoxy during the curing thereof may be determined for the desired epoxy material. Additionally, the epoxy material used may be selected so that it has a coefficient of thermal expansion (CTE) that closely matches that of printed circuit board 14.

The printed circuit board 14 may be selected from any number of electronic substrate materials such as, for example, fiber reinforced board number 4 (FR4), ceramic substrates, metal clad fiber boards, or any other type of rigid substrate material that tends to warp either during the manufacture of the PCB or during the curing of the epoxy encapsulants.

After sufficient time has elapsed to cure epoxy encapsulant material 20, the clamping elements 16 are then removed by removing the retaining elements 18 from clamping elements 16 and support base 12. Once the clamping elements 16 have been removed, the printed circuit board 14 may be removed.

Referring to drawing FIG. 2, a second embodiment of the invention is depicted in a perspective exploded view of a clamping fixture assembly apparatus 30 that is used for holding an array, more than one, of printed circuit boards and also serves as an epoxy dam for the application of the epoxy across the surface of the printed circuit boards. Clamping fixture assembly apparatus 30 includes a support base 32 and a clamping element 34 is secured to support base 32 by retaining elements 42. A plurality of printed circuit boards 36 is placed upon the surface of support base 32 in such a position so as to be exposed by dam apertures 38 that are formed within clamping element 34 when attached to support base 32. A plurality of receiving apertures 40 is located in the outer perimeter corners of support base 32 and is aligned with retaining elements 42 that insert into receiving apertures 40 in support base 32 when the clamping element 34 mates with support base 32. Once clamping element 34 is securely attached to support base 32, the printed circuit boards 36 are retained and exposed through dam apertures 38 in clamping element 34. Next, an epoxy material 44, or any other type of sealant, is applied through the dam apertures 38, the perimeter of which serves as an epoxy dam during the application of the epoxy to the surface of printed circuit boards 36. Next, the clamping fixture assembly apparatus 30 having printed circuit boards contained therein is cured at ambient temperature, or may be cured in an oven to decrease the curing time of the epoxy. While being retained within a secured clamping fixture assembly apparatus 30, the epoxy material 44 on the printed circuit boards 36 cures with minimal warpage of the printed circuit boards 36.

Figure 4:
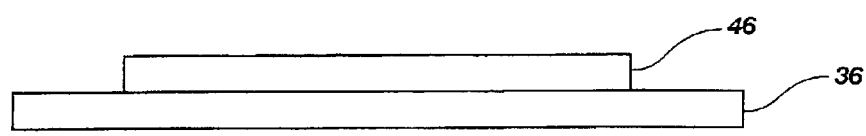
FIG. 4 depicts the end result of a printed circuit board having epoxy thereon cured with minimal board warpage.

Referring to drawing FIGS. 3 and 4, illustrated is a cross-sectional schematic diagram of a printed circuit board 36 having a semiconductor device 46 located thereon. As can be seen in FIG. 4, printed circuit board 36 is substantially planar, having no warpage curvature thereof to cause problems. In contrast, as illustrated in drawing FIG. 3, a printed circuit board 36 having a semiconductor device 46 located thereon exhibits substantial warpage. Returning to drawing FIG. 4, for example, if printed circuit board 36 were a single-inline-memory-module (SIMM), any warpage found in printed circuit board 36 would prevent the printed circuit board 36 from being placed within a single-inline-memory-module (SIMM) by an automated machine for use on a motherboard having a SIMM socket or slot thereon. In other words, the warpage exhibited in printed circuit board 36 would require the manual insertion thereof in a single-inline-memory-module to align within the substantially parallel channels of circuits on a motherboard. Additionally, once printed circuit board 36 is straightened during the insertion process, the flexing of the printed circuit board 36 into a planar configuration would induce stress therein and possibly fracture any electrical or mechanical bonds between semiconductor device 46 mounted on the printed circuit board 36 and the printed circuit board 36. In greatly exaggerated warpage, the likelihood of any fractures of the bonds between the semiconductor device 46 and printed circuit board 36 or stressing of the printed circuit board 36 would be even greater. Other reasons for controlling or reducing warpage in the printed circuit board 36 are to facilitate subsequent process steps involving the printed circuit board 36 by having a greater degree of planarity of the printed circuit board 36 for dicing, marking, labeling, or the addition of other components to the board, particularly where solder reflow processing is required, etc.

Again referring to drawing FIG. 4, a printed circuit board 36 is illustrated that has been cured in a substantially flat, planar condition without any substantial warpage thereof. It is significant that printed circuit board 36 may have the warpage prior to the encapsulation step and that the curing of the epoxy may be used to remove the warpage of printed circuit board 36 and/or that the clamping fixture assembly apparatus 10, 30 may have either a convex or concave curvature thereof to offset and counteract the warpage of the printed circuit boards 14, 36 during the curing of the epoxy.

In order to determine the advantages of clamping a printed circuit boards 14, 36 during encapsulation of semiconductor devices mounted thereon, a series of tests was performed using various encapsulation materials having various dispensing weights and various curing temperatures to compare printed circuit boards having no use of a fixture to retain the board and a printed circuit board retained in a clamping fixture assembly apparatus as described herein. A 16 megabyte semiconductor die mounted in a chip-on-board configuration (COB) in a single-inline-memory-module (SIMM) board was utilized as the baseline or standard printed circuit board. An Asymtek 402b gantry glob top system was utilized to dispense a centralized rectangular pattern of Hysol 4451 material in a dam configuration on the single-inline-memory-module (SIMM) board with the dam configuration having a surface dimension of 2.34 inches by 0.60 inches. The dam material was dispensed at a weight of 0.15 grams. The dam was allowed to cure for one hour at 150° C. in an assembly clean room burn-in oven. After the rectangular dam had been created on the single-inline-memory-module (SIMM) board, a glob top film material was dispensed into the dam region under an array of various process conditions as noted.

The glob top materials were selected from Hysol 4450, which has a standard coefficient of thermal expansion (CTE) of 19, Hysol CNB558-13, which has a CTE of 12, and TraBond FS503, which has a CTE of 35. Each of these glob top materials was applied into the rectangular dam region at various dispense weights ranging from 0.8 grams to 1.6 grams. The thickness of the material was held constant at 0.040 inches. Different cure temperatures and times were also tested. A first cure temperature of 165° C. was used with a time of 45 minutes and a second cure temperature of 120° C. was used for 150 minutes. Both a free state of the single-inline-memory-module (SIMM) board and a restrained state of the single-inline-memory-module (SIMM) board in a clamping fixture assembly apparatus were observed during the curing of the glob top material at the predetermined curing temperatures and curing times.

After the glob top encapsulation had been completed, an optical comparitor was used to measure the deflection of the single-inline-memory-module (SIMM) board to determine the board warpage. A test fixture was made to screw down one end of the single-inline-memory-module (SIMM) board to an aluminum block and then the other end of the board was allowed to bow upward freely. The quantitative value of board deflection was then measured from the top of the aluminum block to the bottom of the single-inline-memory-module (SIMM) board.

At a dispense weight of 1.4 grams, having a thickness of approximately 0.040 inches, the TraBond FS503 had a free deflection of 140 mils. for the single-inline-memory-module (SIMM) board and a restrained deflection for the single-inline-memory-module (SIMM) board of approximately 95 mils. when cured for 45 minutes at 165° C. When cured at 120° C. for 150 minutes, the TraBond FS503 reduced the free deflection for the single-inline-memory-module (SIMM) board of 100 mils. and a restrained deflection for the single-inline-memory-module (SIMM) board of 70 mils. The Hysol 4450 epoxy, when cured at 165° C. for 45 minutes, resulted in a free deflection for the single-inline-memory-module (SIMM) board of nearly 130 mils. and a restrained deflection for the single-inline-memory-module (SIMM) board of approximately 65 mils. When cured at 120° C. for 150 minutes, the Hysol 4450 epoxy resulted in a free deflection for the single-inline-memory-module (SIMM) board of 95 mils. and a restrained deflection for the single-inline-memory-module (SIMM) board of 48 mils. Further, the Hysol 558-13, epoxy when cured at 165° C. for 45 minutes, resulted in a free deflection for the single-inline-memory-module (SIMM) board of approximately 80 mils. and a restrained deflection for the single-inline-memory-module (SIMM) board of 45 mils. The Hysol 558-13 material, when cured at 120° C. for 150 minutes, resulted in a free deflection for the single-inline-memory-module (SIMM) board of 25 mils. and a restrained deflection for the single-inline-memory-module (SIMM) board of about 18 mils.

All of the variables heretofore noted do contribute in some degree to the warpage of the printed circuit board during curing of an encapsulant material, glob top material, etc. To improve the results and thereby minimize warpage of the printed circuit board during curing of an encapsulant material, glob top material, etc., it is important to match the coefficient of thermal expansion (CTE) of the material to that of the printed circuit board. For example, a glob fill coefficient of thermal expansion (CTE) of 12 obtains better results when used with high temperature FR4 boards having a thickness of 0.50 inches. Additionally, the amount of material dispensed across the surface of the printed circuit board is also directly proportional to the amount of warpage. Further, a lower cure temperature of the material significantly reduces board warpage and restraining the printed circuit board (PCB) during the cure process of the material dramatically reduces the warpage of the board.

Figure 5:
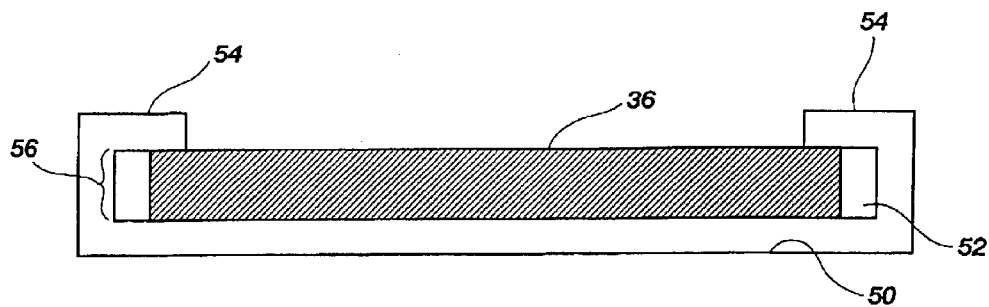
FIG. 5 depicts an alternative clamping fixture that uses a channel for holding a printed circuit board in place.

Referring to drawing FIG. 5, depicted is a cross-sectional schematic diagram of an alternative third embodiment of the clamping fixture assembly apparatus of the present invention used to eliminate or reduce warpage in a printed circuit board (PCB) that has encapsulant material, such as an epoxy, applied to the surface thereof. Clamping fixture assembly apparatus 50 is formed in a unshaped configuration including rails for restraining the edges of the printed circuit board while curing the encapsulant material located thereon and during any processing of the board. Clamping fixture assembly apparatus 50 includes opening 52, which accommodates a suitable printed circuit board 36 which may be contained therein having retaining shoulders 54 clamping the edges of the printed circuit board 36. Opening 52 has a thickness 56 substantially matching that of the thickness of printed circuit board 36. Again, clamping fixture assembly apparatus 50 may have a slight radius of curvature, either convex or concave, to induce or counter a curvature in the printed circuit board 36. Once printed circuit board 36 is removed from the clamping fixture assembly apparatus 50, the printed circuit board 36 will flex, bow, or curve in the opposite direction of the induced curvature by the clamping fixture assembly apparatus 50. Thus, the counter bow or curvature of the clamping fixture assembly apparatus 50 tends to offset, counteract, or nullify any warpage caused by the shrinkage during the curing of encapsulation material, such as epoxy, resulting in a substantially flat or planar printed circuit board 36 having no substantial warpage thereof.

Figure 6:
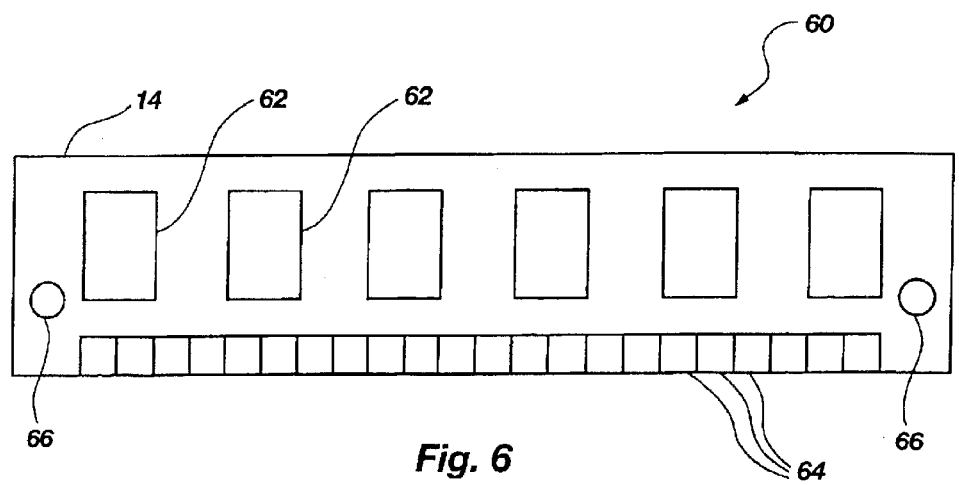
FIG. 6 depicts a single-inline-memory-module (SIMM) having a plurality of semiconductor dice.

Referring to drawing FIG. 6, a single-inline-memory-module (SIMM) 60 is illustrated. The SIMM 60 includes a plurality of semiconductor devices 62 mounted on a substrate 14, a printed circuit board, having apertures 66 therein and having electrical circuits 64 extending along one edge thereof. The semiconductor devices 62 on the substrate 14 may be encapsulated with a suitable material being applied and cured while the substrate 14 is retained in a clamping fixture assembly apparatus such as described herein to help control the warpage of the substrate 14.

Figure 7:
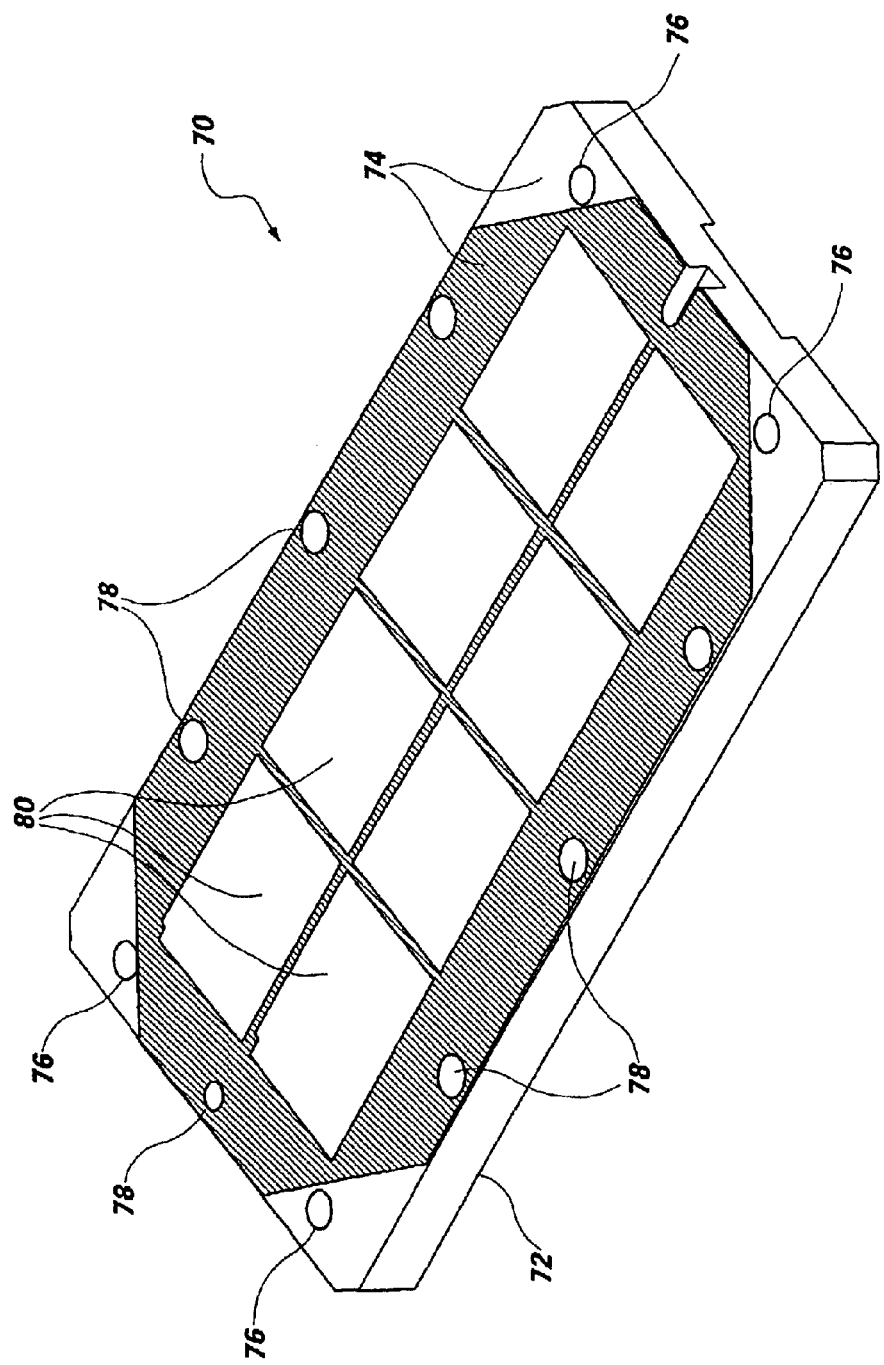
FIG. 7 depicts a perspective view of a multiple dam clamping fixture apparatus according to the present invention.

Referring to drawing FIG. 7, a clamping fixture assembly apparatus 70 is illustrated including a support base 72 and clamping element 74. The support base 72 includes a plurality of apertures 76 therein for receiving portions of retaining elements (not shown) therein to retain the clamping element 74 thereon. The clamping element 74 includes a plurality of rectangular dam apertures 80 therein for the application of a suitable encapsulant material therein with the edges of the apertures 80 serving as dams to retain the material therein to cover a semiconductor device located on a substrate or a printed circuit board (not shown) and a plurality of apertures 78 for receiving portions of a retaining element therein to retain the clamping element 74 on the support base 72 for the application and curing of an encapsulant to the board for any subsequent processing of the board, such as the dicing thereof.

The use of a clamping fixture assembly apparatus of the present invention as described herein eliminates substantial subsequent warpage caused to a printed circuit board during curing of an encapsulant material, such as the curing of epoxy, and allows for easier handling of the printed circuit board during any subsequent processing thereof. Such subsequent processing of the printed circuit board may include a discrete dicing of the board into portions having a discrete semiconductor device located thereon. The machine utilized to perform such dicing of the printed circuit board typically requires a substantially flat printed circuit board for dicing operations and any warpage of the board may cause errors during the dicing process. Additionally, the use of a mold dam to limit the encapsulant material to a desired region on a printed circuit board substantially reduces or eliminates the intermediate step of applying an encapsulant material, such as an epoxy encapsulant, requiring the use of masks or stencils for the application of the material to areas of the board. The one-step application of an encapsulant material, such as an epoxy, while the printed circuit board is clamped in a clamping fixture assembly apparatus of the present invention allows for controlled application of the material and the curing thereof without further undue handling of the printed circuit board during the application and curing stages of the material. This results in a more consistent and uniform application and curing of materials to the printed circuit board. Additionally, when the substrate material, such as a printed circuit board, is held having a substantially uniform planar or flat surface thereon, an entire chip wafer may be applied to the surface of the substrate and cured with minimal damage because of the effect of the clamping fixture assembly apparatus of the present invention. This allows for the dicing of the substrate having semiconductor devices mounted thereon to be consistently, accurately and reliably performed with minimal error and loss of the diced substrate and semiconductor devices thereon.

Although the preferred embodiments of the present invention have been disclosed for illustrative purposes, those skilled in the art will appreciate that various modifications, additions, and substitutions are possible without departing from the scope and spirit of the invention as disclosed in the accompanying claims.

What is claimed is:

1. A method of applying a material on a printed circuit board, comprising:

providing a base having a surface having a radius of curvature including one of a convex radius of curvature and a concave radius of curvature for mounting the printed circuit board thereon, the base having at least one aperture therein;

providing at least two clamping elements for use with the base;

providing at least two retaining elements for use with the base and the at least two clamping elements;

placing the printed circuit board on the base;

holding at least two edges of the printed circuit board with a portion of a clamping element of the at least two clamping elements to the base by engaging the at least two retaining elements with portions of the clamping element for conforming the printed circuit board to the surface of the base, the printed circuit board having a radius of curvature including one of a convex radius of curvature and a concave radius of curvature of at least a portion thereof as a result of conforming to the surface of the base, the radius of curvature of the base opposite the radius of curvature of the printed circuit board; and applying a material to the base for retaining the material thereon.

2. The method of claim 1, wherein the base includes a plurality of apertures therein, each aperture of the plurality of apertures for receiving a portion of a retaining element of the at least two retaining elements therein.

3. The method of claim 1, wherein each of the at least two clamping elements includes at least one aperture therein for receiving a portion of a retaining element of the at least two retaining elements therein.

4. The method of claim 1, wherein each of the at least two clamping elements comprises an elongated member.

5. The method of claim 1, further comprising:
   removing the at least two retaining elements from the base and the at least two clamping elements; and
   removing the at least two clamping elements from the printed circuit board.

6. The method of claim 5, further comprising:
   removing the printed circuit board from the base.

7. The method of claim 1, further comprising:
   removing the at least two clamping elements from the base.

8. A method for applying a material located on a portion of a printed circuit board comprising:
   providing a base having a surface having a radius of curvature including one of a convex radius of curvature and a concave radius of curvature for mounting the printed circuit board thereon;
   providing clamping elements for engaging at least a portion of an edge of the printed circuit board, each of the clamping elements integrally attached to the base;
   mounting at least one clamping element of the clamping elements along the edge of the printed circuit board;
   conforming the printed circuit board to the surface of the base by engaging a portion of the printed circuit board with a portion of the at least one clamping element, the printed circuit board having a radius of curvature including one of a convex radius of curvature and a concave radius of curvature when conformed to the surface of the base, the radius of curvature of the base opposite to the radius of curvature of the printed circuit board; and
   retaining a material on the printed circuit board.

9. The method of claim 8, further comprising:
   removing the printed circuit board from the base; and
   removing the clamping elements from engaging the printed circuit board.

10. A method for curing a sealing material on a printed circuit board comprising:
    providing a base having a surface having a radius of curvature including one of a convex radius of curvature and a concave radius of curvature for mounting the printed circuit board thereon;
    providing a clamping element for engaging at least a portion of a surface of the printed circuit board;
    providing at least one retaining element for securing the clamping element to the base during curing of a sealing material;
    engaging the at least one retaining element with a portion of the clamping element causing conforming of the printed circuit board to the surface of the base, the printed circuit board having a radius of curvature including one of a convex radius of curvature and a concave radius of curvature of at least a portion thereof, the radius of curvature of the base opposite to the radius of curvature of the printed circuit board;
    depositing sealing material on to the printed circuit board; and
    removing the printed circuit board from the base.

11. The method of claim 10, further comprising:
    removing the clamping element.

* * * * *

UNITED STATES PATENT AND TRADEMARK OFFICE
CERTIFICATE OF CORRECTION

PATENT NO.        : 6,830,719 B2
APPLICATION NO. : 10/358573
DATED             : December 14, 2004
INVENTOR(S)       : Derek J. Gochnour and Leonard E. Mess It is certified that error appears in the above-identified patent and that said Letters Patent is hereby corrected as shown below:

COLUMN 7,   LINE 19,   change "unshaped" to --u-shaped--

Signed and Sealed this

Sixth Day of November, 2007

JON W. DUDAS
*Director of the United States Patent and Trademark Office*